US008092046B2

(12) United States Patent
Wu et al.

(10) Patent No.: US 8,092,046 B2
(45) Date of Patent: Jan. 10, 2012

(54) LED LIGHTING DEVICE

(75) Inventors: Meng-Chai Wu, Jhubei (TW); He-Shun Yang, Jhubei (TW)

(73) Assignee: Lextar Electronics Corp., Hsinchu (TW)

( * ) Notice: Subject to any disclaimer, the term of this patent is extended or adjusted under 35 U.S.C. 154(b) by 116 days.

(21) Appl. No.: 12/554,128

(22) Filed: Sep. 4, 2009

(65) Prior Publication Data
US 2010/0327301 A1 Dec. 30, 2010

(30) Foreign Application Priority Data

Jun. 29, 2009 (TW) .............................. 98121786 A

(51) Int. Cl.
*F21V 31/00* (2006.01)
*H01L 33/52* (2010.01)
(52) U.S. Cl. .................. 362/249.02; 362/267; 362/268; 257/100
(58) Field of Classification Search ............. 362/249.02, 362/231, 244, 267, 555, 237, 800, 268, 331, 362/310; 257/100
See application file for complete search history.

(56) References Cited

U.S. PATENT DOCUMENTS

| 5,969,414 | A | * | 10/1999 | Parthasarathi et al. | 257/675 |
|---|---|---|---|---|---|
| 6,404,131 | B1 | * | 6/2002 | Kawano et al. | 315/82 |
| 7,040,779 | B2 | * | 5/2006 | Lamke et al. | 362/231 |
| 7,436,002 | B2 | * | 10/2008 | Brunner et al. | 257/99 |
| 7,744,236 | B2 | * | 6/2010 | Hsu et al. | 362/101 |
| 7,815,343 | B2 | * | 10/2010 | Nii et al. | 362/311.03 |
| 2006/0274524 | A1 | * | 12/2006 | Chang et al. | 362/231 |
| 2009/0002984 | A1 | * | 1/2009 | Liu et al. | 362/237 |
| 2010/0214785 | A1 | * | 8/2010 | Chen | 362/267 |

* cited by examiner

*Primary Examiner* — Peggy A. Neils
(74) *Attorney, Agent, or Firm* — Kile Goekjian Reed & McManus PLLC

(57) ABSTRACT

An LED lighting device includes a circuit board, a plurality of LED units, a waterproof layer and a middle layer. The LED units are disposed on the circuit board by surface mounted way. The light beam emitted from the LED units emits from the light-emitting surface. The waterproof layer wraps the circuit board and the LED units. The middle layer is located between the light-emitting surface and the water-proof layer. The middle layer extends from a direction of the LED units being disposed on the circuit board so that the middle layer fully covers the light-emitting surface. The light beams passing through the light-emitting surface enters into the waterproof layer via the middle layer. Thereby, the middle layer is located between the LED units and the waterproof layer to make the color of the light beam be more uniform.

9 Claims, 4 Drawing Sheets

LED LIGHTING DEVICE

CROSS-REFERENCE TO RELATED APPLICATION

This application claims priority under 35 U.S.C. §119 to Taiwan Patent Application No. 098121786, filed on Jun. 29, 2009, in the Taiwan Intellectual Property Office, the entire contents of which are hereby incorporated by reference.

BACKGROUND OF THE INVENTION

1. Field of the Invention

The present invention relates to an LED lighting device. In particular, the present invention relates to a lighting device with LED units.

2. Description of Related Art

Reference is made to FIG. 1. The LED lighting device of the prior art includes a circuit board 1a, a plurality of LED units 2a and a waterproof layer 3a. The LED lighting units 2a is welded onto the circuit board 1a. The waterproof layer 3a wraps the circuit board 1a and the LED lighting units 2a. Each of the LED lighting units 2a has a supporting frame 21a, two conducting wire electrical pins 22a, an LED chip 23a, two chip conducting wires 24a and a package layer 25a. The two conducting wire electrical pins 22a are respectively welded with the positive pole and the negative pole of the circuit board 1a. The LED chip 23a is respectively and eclectically connected with the two conducting wire electrical pins 22a via the two chip conducting wires 24a. The package layer 25a covers the LED chip 23a. Thereby, the circuit board 1a provides power to the LED units 2a and controls the LED units 2a to be turned on or off. When the LED units 2a is turned on, the light beam emitted from the LED units 2a passes though the package layer 25a and the waterproof layer 3a for lighting.

However, the waterproof layer 3a of the LED lighting device wraps the LED chip 23a and the package layer 25a. The surface mounted strength between the waterproof layer 23a and the package layer 25a is weak. Part of the mounted surface will be stripped due to the temperature changes The color temperature of the light beam changed so that the color of the light beam is not uniform.

SUMMARY OF THE INVENTION

One particular aspect of the present invention is to provide an LED lighting device. The middle layer of the LED lighting device is located between the LED lighting unit and the waterproof layer so that the light beam can passes through the package layer, the middle layer and the waterproof layer. The color of the light beam is uniform.

The LED lighting device includes a circuit board, a plurality of LED units connected with the circuit board, a waterproof layer and a middle layer. Each of the LED units has a light-emitting surface. The waterproof layer wraps the circuit board and the LED units. The middle layer is located between the light-emitting surface and the water-proof layer. The middle layer fully covers the light-emitting surface. Each of the light beams emitted from the LED units passes through the light-emitting surface, the middle layer and the waterproof layer.

The present invention has the following characteristics.

1. The middle layer is located between the light-emitting surface of the LED unit and the waterproof layer, and fully covers the light-emitting surface. Therefore, each of the light beams emitted from the LED units passes through the light-emitting surface, the middle layer and the waterproof layer The color of the light beam of the LED unit is uniform.

2. The middle layer is stably located between the LED unit and the waterproof layer to prevent the light-emitting surface of the Led unit and the waterproof layer from being stripped. The color of the light beam is uniform.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Figure 1:
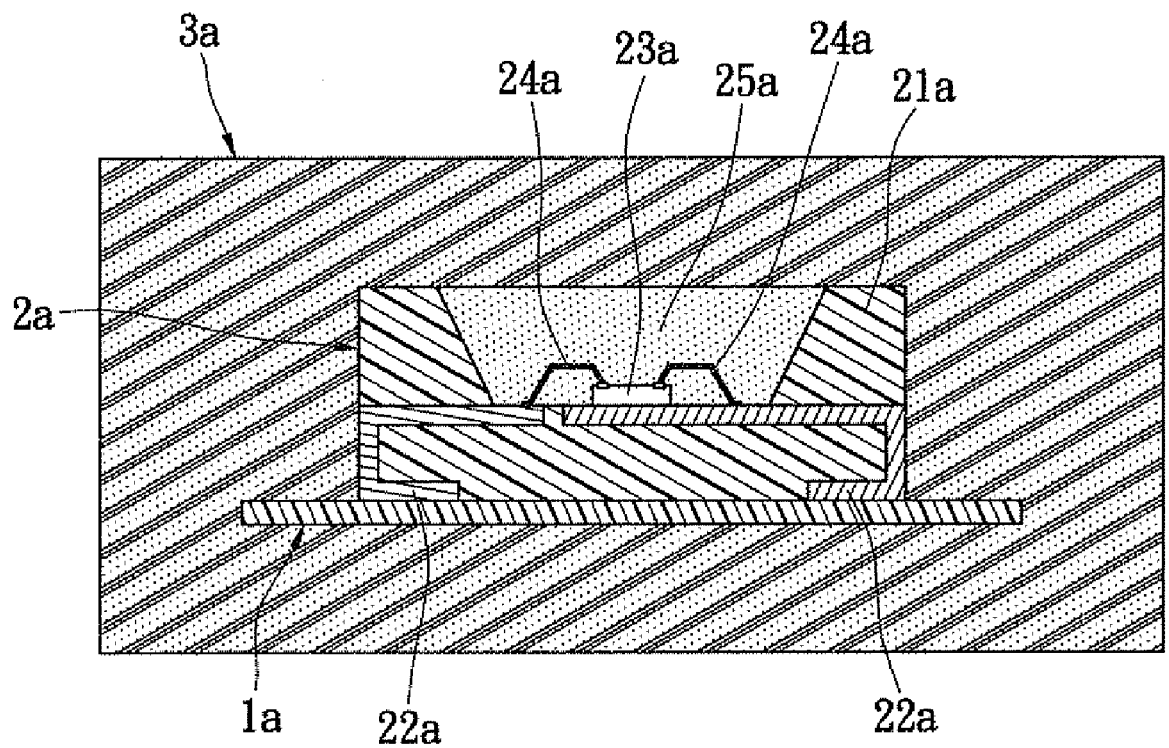
FIG. 1 is a cross-sectional diagram of the LED lighting device of the prior art.
Figure 2:
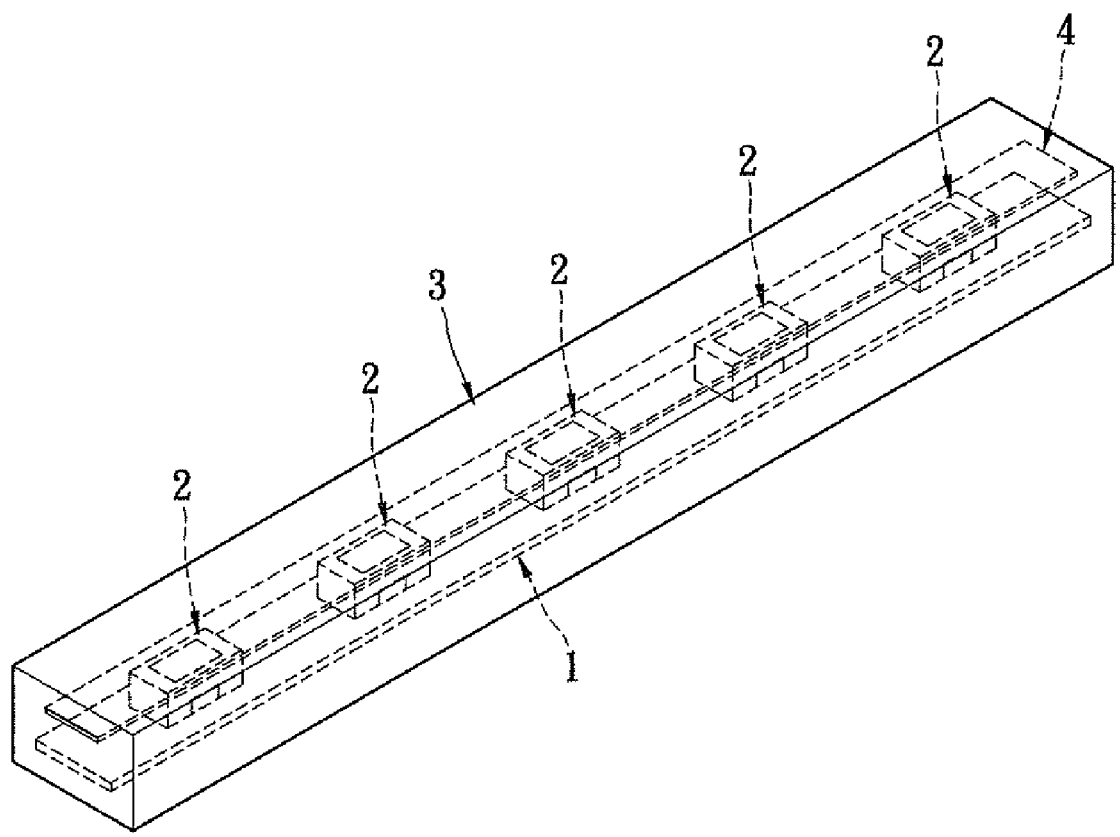
FIG. 2 is a perspective view of the LED lighting device of the present invention.
Figure 3:
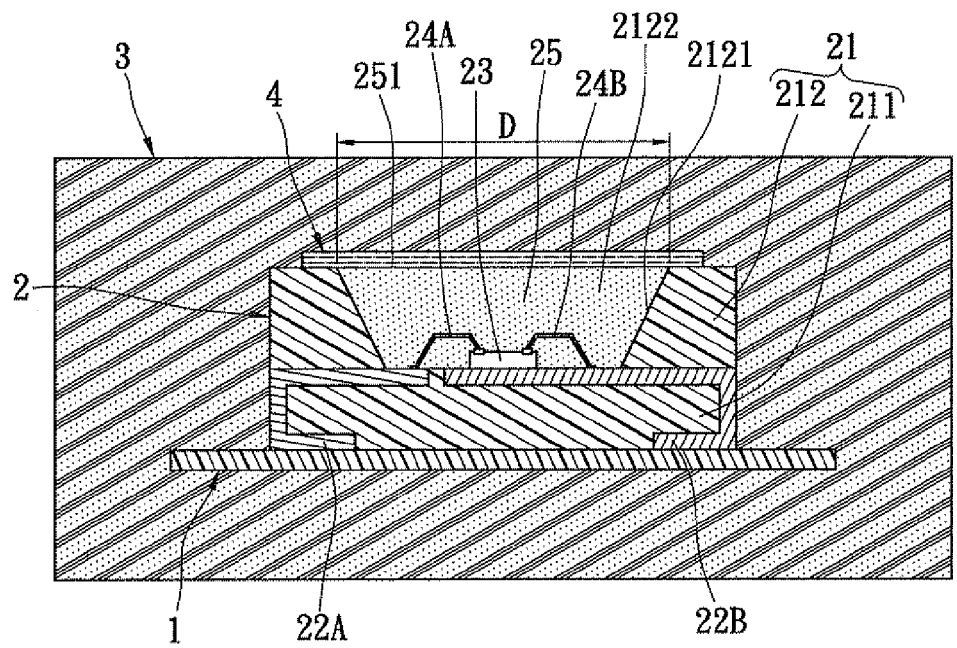
FIG. 3 is a cross-sectional diagram of the LED lighting device of the present invention.

Reference is made to FIGS. 2 and 3. The LED lighting device includes a circuit board 1, a plurality of LED units 2, a waterproof layer 3 and a middle layer 4.

The LED units 2 are disposed on the circuit board 1 at intervals from one side of the circuit board 1 to another side of the circuit board 1. The LED units 2 are welded with the circuit board 1 to electrically connect with the circuit board 1. The circuit board 1 provides power to the LED units 2 and controls the LED units 2 to be turned on or off. Each of the LED units 2 has a supporting frame 21, two conducting wire electrical pins 22A, 22B, a LED chip 23, two chip conducting wires 24A, 24B and a package layer 25. The supporting frame 21 has a base portion 211 and two light-guiding portions 212 that are faced to each other. The base portion 211 and the light-guiding portions 212 are integrated into one piece. The bottom of the base portion 211 is fastened on the circuit board 1. The top of the base portion 211 extends to form the light-guiding portions 212. Each of the light-guiding portions 212 has a light-guiding surface 2121. The two light-guiding surfaces 2121 and the bas base portion 211 form a concave trough 2122. The width of the concave trough 2122 becomes wider and wider from the bottom of the light-guiding portion 212 to top of the light-guiding portions 212, and the maximum width of the concave trough 2122 is D. The two conducting wire electrical pins 22A, 22B are fastened on the base portion 211 and do not contact each other. One end of the two conducting wire electrical pins 22A, 22B exposes to outside of the top of the base portion 211 and another end is respectively welded with the positive pole and the negative pole of the circuit board 1. The LED chip 23 is placed in the concave trough 2122 and is fastened on the top of the base portion. The LED chip 23 is respectively and electrically connected with the two conducting wire electrical pins 22A, 22B via the two chip conducting wires 24A, 24B. The package layer 25 is made of silicon material and is filled into the concave trough 2122. The top of the package layer 25 has a light-emitting surface 251. The width of the light-emitting surface 251 corresponds to the maximum width D of the concave trough 2122. The package layer 25 covers the LED chip 23 and is located between the two light-guiding surfaces 2121. Thereby, the light beam emitted from the LED chip 23 passes through the light-emitting surface 251 of the package layer 25. Moreover, the package layer can contain phosphor powder. The light beam is stimulated by the phosphor to form different colors so that the color of the light beam that passes through the package layer 25 is changed. However, the quantity of the LED unit 2 is not limited to a specific number and depends on the requirements or the illumination. The quantity of the LED unit 2 can be one or more than one. The LED units 2 are disposed from one end of the circuit board 1 to another end of the circuit board 1 at intervals.

The water proof layer 3 is made of PVC or silicon material. The waterproof layer 3 is transparent and has waterproof effect and dustproof effect. In this embodiment, the waterproof layer 3 is manufactured by the squeezing method to wrap the circuit board 1 and the LED units 2, but not limited to above.

The middle layer 4 is located between the light-emitting surface 251 of the LED unit 2 and the waterproof layer 3. The middle layer 4 is located above the light-emitting surface 251 of the package layer 25, and the width of the middle layer 4 is larger than the width of the light-emitting surface 251 so that the middle layer fully covers the light-emitting surface 251. The middle layer 4 extends along the direction of the LED units 2 being disposed on the circuit board 1 (as shown in FIG. 2) so that the light-emitting surface 251 of the package layer 25 of the LED unit 2 is covered below the middle layer 4. Thereby, the light beam passing through the light-emitting surface 251 enters into the waterproof layer 3 via the middle layer 4. However, the middle layer 4 is a gas layer or a liquid layer (as shown in FIG. 3). The gas layer can be air or an inertia gas. The liquid layer can be a liquid that is transparent and not conducted, such as alcohol or silica gel oil. Especially for the liquid that is transparent, not conducted and its index of refraction is higher than 1.33, the light beam emitted from the LED unit 2 can pass through the middle layer 4 by the same way to generate the uniform color.

Figure 4:
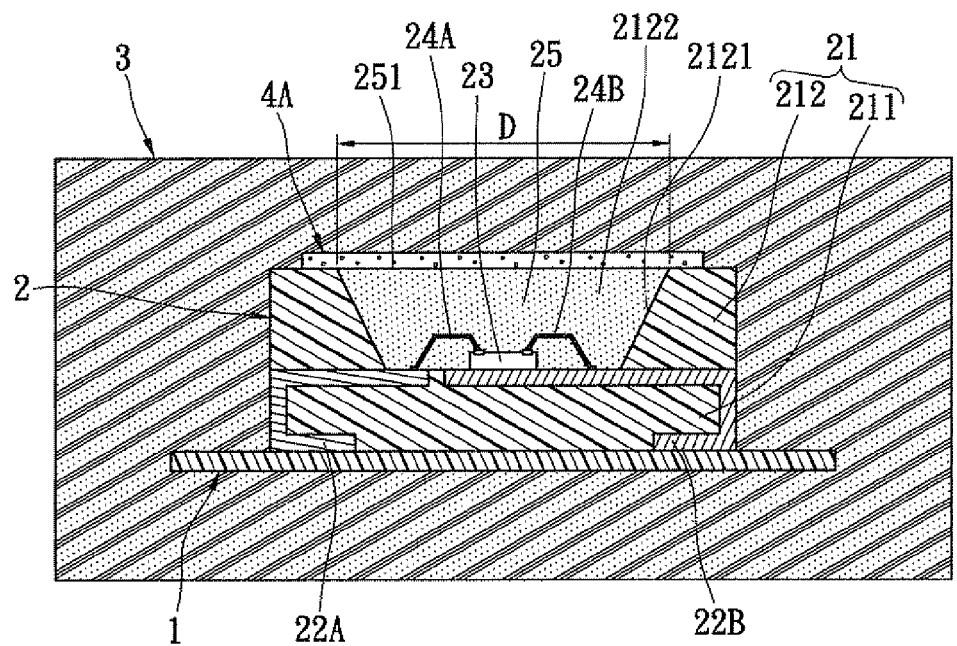
FIG. 4 is a cross-sectional diagram of the LED lighting device of the second embodiment of the present invention.

The middle layer 4 can be changed. Reference is made to FIG. 4, the middle layer 4A contains tiny solid particles. When the dimension of the tiny solid particles is smaller than 0.1 mm, the light beam emitted from the LED unit 2 can pass through the middle layer 4A by the same way to generate the uniform color. The material of the tiny solid particles can be metal, metal oxide, oxide silicon, talcum, silica gel, or plastic, but not limited to above.

Figure 5:
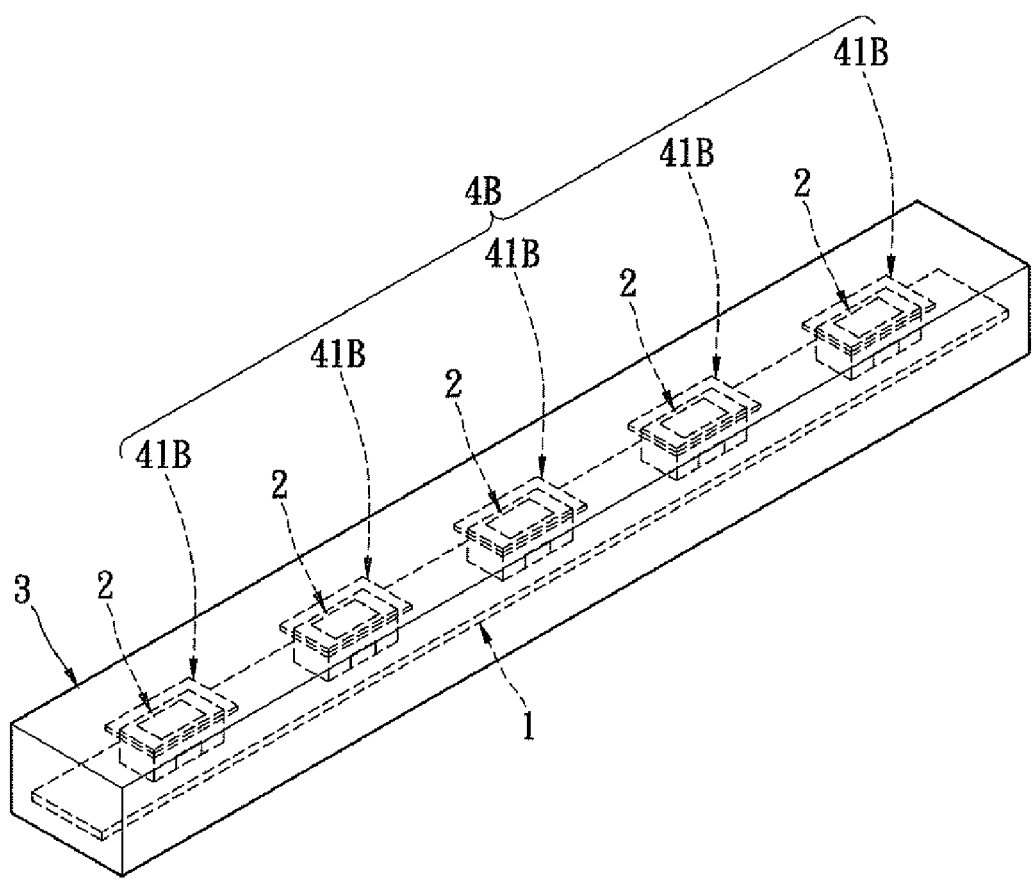
FIG. 5 is a perspective view of the LED lighting device of the third embodiment of the present invention.
Figure 6:
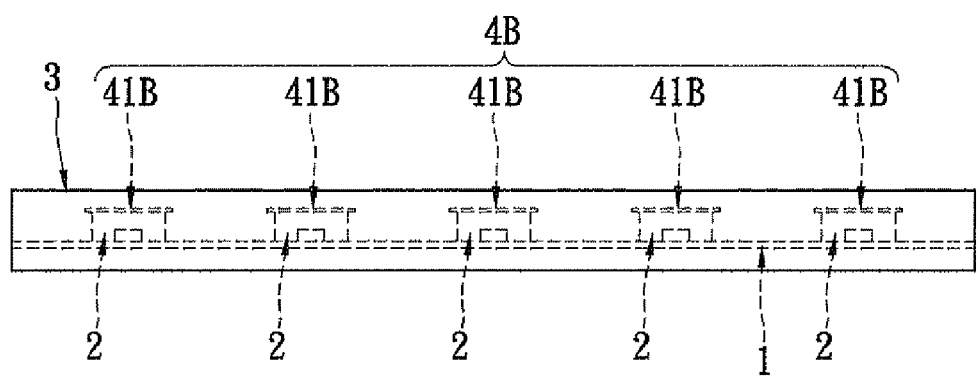
FIG. 6 is a side view of the LED lighting device of the third embodiment of the present invention.

Reference is made to FIGS. 5 and 6. The middle layer 4B includes a plurality of cover layers 41B, and the quantity of the cover layers 41B corresponds to the quantity of the LED units 2. When the quantity of the LED units 2 is one or more than one, the quantity of the cover layers 41B is equal to the quantity of the LED units 2. Each of the cover layers 41B covers the light-emitting surface (not shown in the figure) of one LED unit 2. Therefore, the middle layer 4B fully covers the light-emitting surface of the LED unit 2. The light beam emitted from the LED unit 2 passes through the light-emitting surface, the middle layer 4B and the waterproof layer 3. Furthermore, the middle layer 4B can be a rectangular thin layer (as shown in FIG. 5), but not limited to above.

The present invention has the following characteristics.

1. The middle layer 4 is located between the light-emitting surface 251 and the waterproof layer and fully covers the light-emitting surface 251 so that the light beam passes through the light-emitting surface 251, the middle layer 4 and the waterproof layer 3.

2. The middle layer 4 is located between the LED unit 2 and the waterproof layer 3 to prevent the combined surface of the LED unit 2 and the waterproof layer 3 from being stripped. The color of the light beam is uniform.

3. The air, inertia gas, tiny solid particles or liquid that is transparent and not conducted in the middle layer 4 can make the light path be more stable to assure the color of the light beam being uniform.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. An LED lighting device, comprising:
   a circuit board;
   at least one LED unit disposed on the circuit board along a predetermined direction, wherein each LED unit has a light-emitting surface configured to permit light emission toward a predetermined direction;
   a spacing layer formed above the LED unit fully covering the light-emitting surface in the path of light emission; and
   a waterproof layer wrapping the circuit board, the LED units, and the spacing layer, and in immediate contact with the lateral surface of the LED unit;
   wherein the spacing layer is arranged between the light-emitting surface and the water-proof layer, and wherein the light emitted from each LED unit passes through the light-emitting surface, the spacing layer and the waterproof layer.

2. The LED lighting device as claimed in claim 1, wherein the LED lighting device has at least two LED units, and wherein the spacing layer is arranged substantially along the direction of the LED units.

3. The LED lighting device as claimed in claim 2, wherein the spacing layer is divided into at least two cover layers, the quantity of the cover layers correspond to the quantity of the LED units, and each cover layer respectively covers the light-emitting surface of each LED unit.

4. The LED lighting device as claimed in claim 3, wherein the cover layer is a rectangular thin layer.

5. The LED lighting device as claimed in claim 1, wherein each LED unit has a package layer, wherein the light-emitting surface is located at the top of the package, wherein the package layer contains phosphor powder, whereby the light passing through the package layer is excited to form different colors.

6. The LED lighting device as claimed in claim 1, wherein the spacing layer contains air, inert gas, or tiny solid particles of dimension smaller than 0.1 mm.

7. The LED lighting device as claimed in claim 6, wherein the material of the tiny solid particle is metal, metal oxide, oxide silicon, talcum, silica gel, or plastic.

8. The LED lighting device as claimed in claim 1, wherein the spacing layer is filled with a light-transparent and non-conductive liquid.

9. The LED lighting device as claimed in claim 8, wherein the liquid is alcohol or silica gel oil.

* * * * *